US007469242B2

(12) United States Patent
Tompras et al.

(10) Patent No.: US 7,469,242 B2
(45) Date of Patent: Dec. 23, 2008

(54) CENTRAL BASED COMPUTER NETWORK OF SOLID MODELS AND ASSOCIATED DATA WITH SEARCH CAPABILITY

(75) Inventors: Anthony D. Tompras, Chesterfield, MO (US); Michael E. Herbstreit, Saint Louis, MO (US); William D. Macy, St. Peters, MO (US); Edward J. Levinskas, Saint Charles, MO (US)

(73) Assignee: The Boeing Company, Chicago, IL (US)

( * ) Notice: Subject to any disclaimer, the term of this patent is extended or adjusted under 35 U.S.C. 154(b) by 180 days.

(21) Appl. No.: 10/155,286

(22) Filed: May 23, 2002

(65) Prior Publication Data

US 2003/0220911 A1 Nov. 27, 2003

(51) Int. Cl.
G06F 17/30 (2006.01)
G06F 19/00 (2006.01)
G05B 11/01 (2006.01)

(52) U.S. Cl. .................. 707/3; 707/10; 707/104.1; 700/78; 700/182; 715/964; 715/968

(58) Field of Classification Search .............. 707/1–10, 707/100–103, 200–206, 104.1; 345/751–759, 345/964, 419–420; 709/201–203; 700/95, 700/97, 98, 117–118, 104, 146, 182; 715/964, 715/968

See application file for complete search history.

(56) References Cited

U.S. PATENT DOCUMENTS

| | | | | | |
|---|---|---|---|---|---|
| 5,355,445 | A | * | 10/1994 | Shibao et al. | 706/50 |
| 5,701,403 | A | * | 12/1997 | Watanabe et al. | 345/419 |
| 5,896,138 | A | * | 4/1999 | Riley | 345/440 |
| 5,945,995 | A | * | 8/1999 | Higuchi et al. | 345/420 |
| 6,016,487 | A | * | 1/2000 | Rioux et al. | 707/2 |
| 6,295,513 | B1 | * | 9/2001 | Thackston | 703/1 |
| 6,629,093 | B1 | * | 9/2003 | Davis et al. | 707/3 |
| 6,867,771 | B2 | * | 3/2005 | Kripac | 345/420 |
| 7,003,371 | B2 | * | 2/2006 | Tsuchida et al. | 700/182 |
| 7,266,419 | B2 | * | 9/2007 | Sakai et al. | 700/145 |
| 2002/0073114 | A1 | * | 6/2002 | Nicastro et al. | 707/500 |

(Continued)

FOREIGN PATENT DOCUMENTS

WO   WO 01/63429   *   8/2001

OTHER PUBLICATIONS

Thomas Funkhouser et al. "A search engine for 3D models", ACM transaction on Graphics vol. 22, issie 1, Jan. 2003, pp. 83-105.*

(Continued)

*Primary Examiner*—Srirama Channavajjala

(57) ABSTRACT

The present invention is a network-based system and method for providing a centrally controlled single source location for storing electronic data (including but not limited to part information such as Computer Aided Designed [CAD] solid models, associated textual data, images, mathematical algorithms, and links to associative websites) to be accessed by users creating various products/designs using various application programs. The system includes a central computer system and a plurality of user computer systems coupled to a network. The central computer system stores a plurality of computer solid models. From a user computer system, a user accesses an application program run by the central computer system in order to search and retrieve the stored data files (solid models).

21 Claims, 12 Drawing Sheets

U.S. PATENT DOCUMENTS

2002/0184246 A1\* 12/2002 Shkolnik .................. 707/203
2005/0071135 A1\* 3/2005 Vredenburgh et al. .......... 703/1

OTHER PUBLICATIONS

Weidner,R , "A component based implementation of agents and broker coordination", Aerospace conference, 2001 IEEE proceedings, vol. 6, Mar. 2001, pp. 2889-2894.\*

George Cybenko et al. "pattern recognition of 3D CAD objects: towards an electornic yellow pages of mechanical parts", smart engineering systems design, vol. 1, pp. 1-13, 1997.\*

Cha Zhang et al. "indexing and retrieval of 3D Models aided by active learning" 2001, pp. 615-616.\*

\* cited by examiner

FIG. 13

CENTRAL BASED COMPUTER NETWORK OF SOLID MODELS AND ASSOCIATED DATA WITH SEARCH CAPABILITY

FIELD OF THE INVENTION

This invention relates to design applications, and, more specifically, to multi-platform design application systems.

BACKGROUND OF THE INVENTION

In the design environment, graphical solid model representations of parts and components are used to build virtual assemblies. The virtual assemblies are then used to build a product. Although the same parts may be used repeatedly throughout a design, historically designers either manually search for and borrowed those models created by other designers, or they redesigned or built new parts. Not having a central single source of information (i.e., models) led to significant time being spent finding parts already modeled or re-designing models again. Re-designing models also added a margin of error since different designers would most likely not model a part in the same manner.

Because of this uncontrolled method of obtaining models, the reliability of uniform designs was practically non-existent. In addition, the information and detail contained in any model was limited to that deemed necessary by the designer, therefore limiting the usefulness of the data to another user. Redundancy of effort and inaccuracy in design or data adds costs to any design. Furthermore this inefficiency may be compounded across a large organization or corporation because multiple Computer Aided Design (CAD) applications/systems may be used to perform design work which does not permit a simple means of sharing and standardizing the information.

Therefore, a need exists to make system/product design more efficient and uniform across a company performing a plurality of designs using various CAD systems.

SUMMARY OF THE INVENTION

The present invention provides a network-based system and method for providing data and information of many types, from a centrally controlled, single source location for storage, to users that utilize the data/information within various projects, programs, work scenarios, etc., on a multitude of software applications and hardware systems, and permits the capability of the data/information to be transmitted, forwarded, utilized in other downstream applications. The description provided demonstrates the application of these methods and technologies in the form of a Solid Model Library (SML) tool. The example of the SML tool provides a network-based system and method for providing graphical CAD solid models and other data from a centrally controlled, single source location to be accessed by users creating various designs using various design application programs. A SML system includes a central computer system and a plurality of user computer systems coupled to a network. The central computer system includes an application that stores and delivers a plurality of CAD solid models and other data based on approval designated by a previously assigned approval authority. The solid models and other data are identified by associated search criteria. The user computer systems include a display device, a user interface device, and a processing device coupled to the display device and the user interface device. The processing device includes a first component that accesses the application program of the central computer system based on previously approved access authority. The user interface device allows for entry of a search value in the accessed application program based on at least one component of the search criteria. The application program includes a first component that searches the central computer system based on the entered search value, and a second component that sends the results of the search to the user computer system. The processing device includes a second component that presents the sent results of the search on the display device.

As will be readily appreciated from the foregoing summary, the invention provides a network-based data library with searching capabilities, thereby providing a more efficient and uniform system across a company for performing a plurality of functions (designs) using various (CAD) systems.

BRIEF DESCRIPTION OF THE DRAWINGS

The preferred and alternative embodiments of the present invention are described in detail below with reference to the following drawings.

FIGS. 3-13 are screen shots of an exemplary graphical user interface formed in accordance with the present invention.

DETAILED DESCRIPTION OF THE INVENTION

Figure 1:
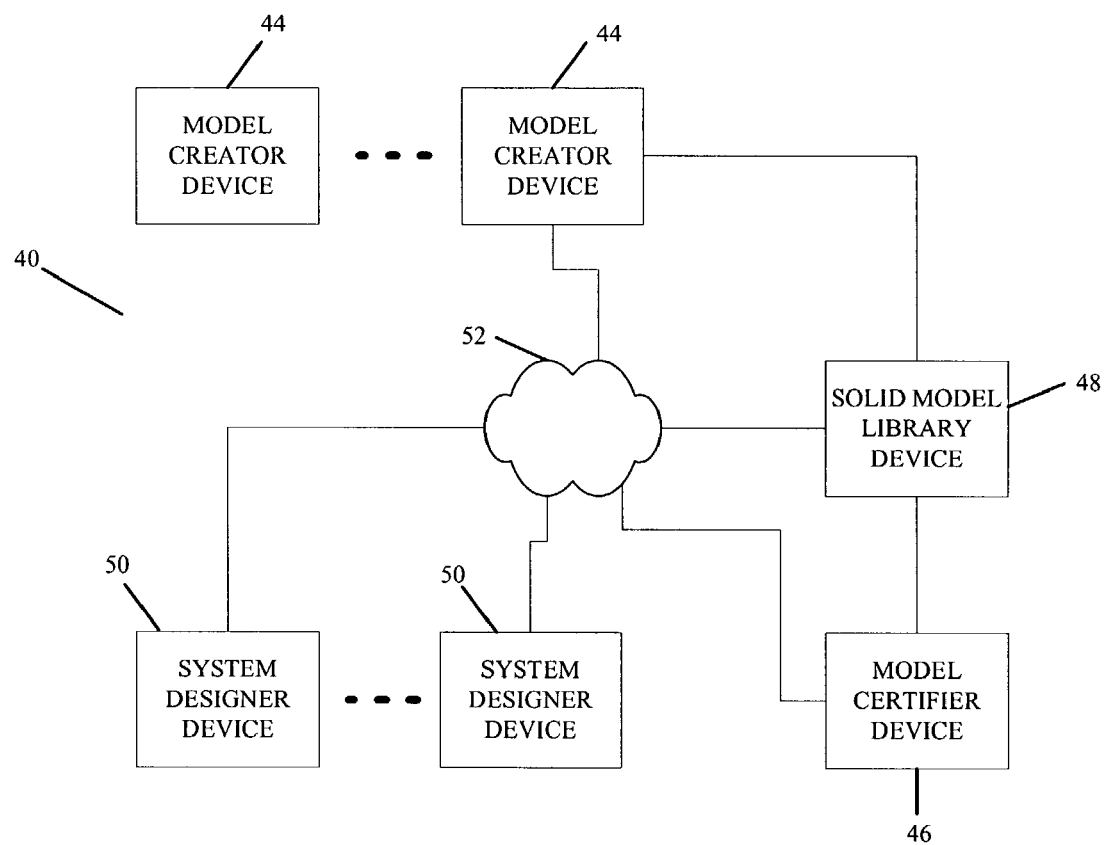
FIG. 1 is a block diagram of an exemplary system that implements the present invention.

FIG. 1 illustrates a system 40 that provides a central single source of three-dimensional graphical solid models for system/product design. The system 40 includes one or more model creator devices 44, at least one model certifier device 46, a solid model library device 48, and a plurality of user devices 50. The user devices 50 are suitably coupled to the solid model library device 48 via a data network 52, such as, without limitation, a Local Area Network (LAN), a Wide Area Network (WAN) such as an intranet, or the Internet. The model creator devices 44 and the model certifier device 46 are connected to the solid model library device 48 directly or via the network 52. Model creators using an associated model creator device 44 create three-dimensional solid models to be identified, accessed and used by users using an associated user device 50. Users can also create sold models. Created three-dimensional solid models are sent from the model creator device 44 to the solid model library device 48. A model certifier uses an associated model certifier device 46 to approve or disapprove the three-dimensional solid models sent by the model creator or by a user. Once the model certifier has approved a created three-dimensional solid model, the approved three-dimensional solid model is made accessible to users using their associated user devices 50 by accessing the solid model library device 48 over the network 52.

Figure 2:
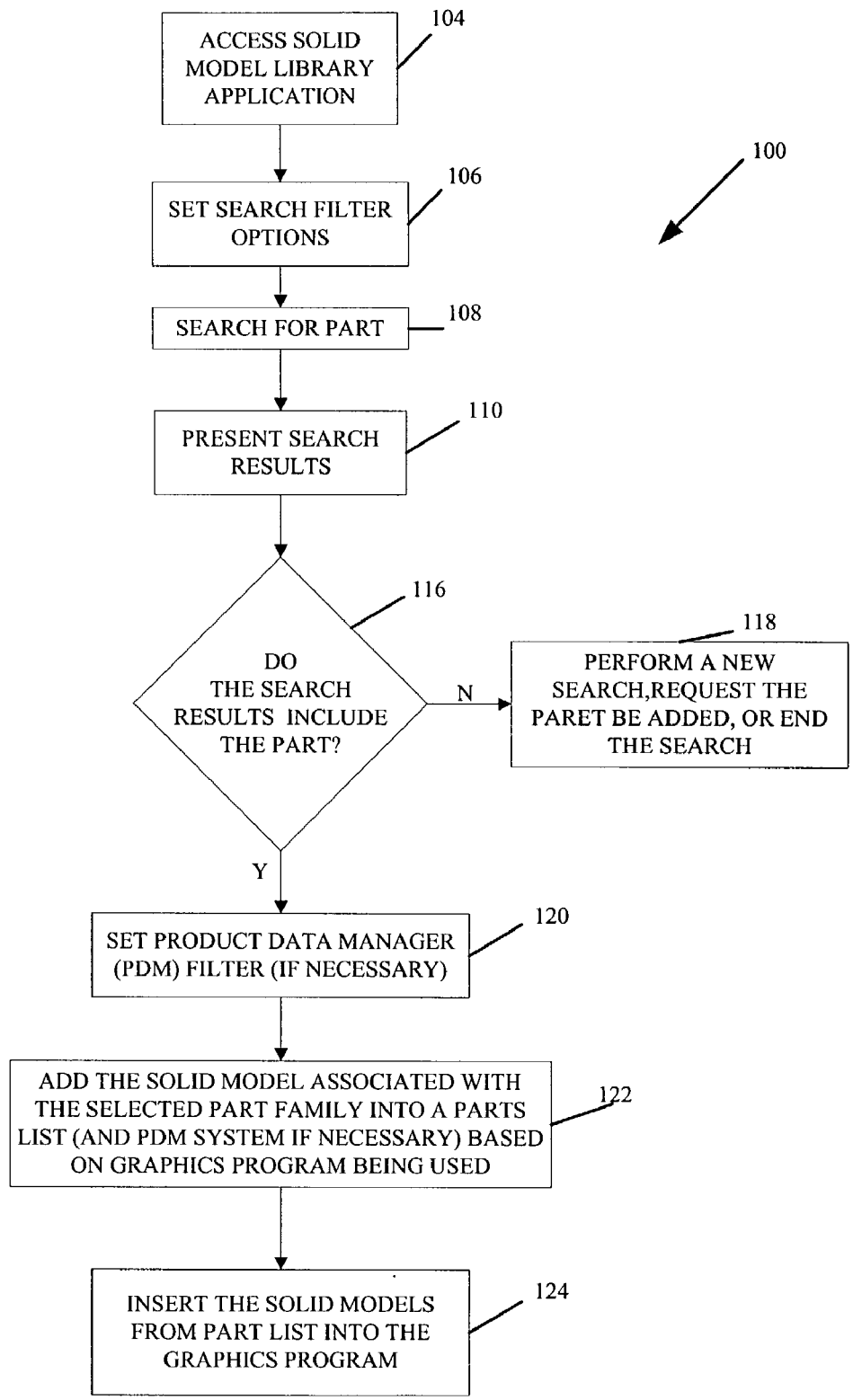
FIG. 2 is a flow diagram of an exemplary process performed in accordance with the present invention.

FIG. 2 illustrates an exemplary method 100 that a user follows when retrieving solid models from the solid model library device 48 (FIG. 1) using an associated user device 50 (FIG. 1). Referring now to FIGS. 1 and 2, at block 104, the user logs into and gains access to a solid model library (SML) tool executed by the solid model library device 48. The SML tool is suitably a network-based application program or graphical user interface, such as an intranet or Internet website. Access to the SML system preferably requires a pre-approved account and password, thereby limiting user access to only those that require the functions provided by the solid model library device 48.

Next, at block 106, the user selects the filter options to limit the models included in the search. Filter options are selected via the user interface application and the user device 50 associated with the user. The filter options are set by selecting the "SET" button associated with the filter selections on the user interface application. Next, at block 108, the user performs a search for a part model the user desires to insert into the design within a CAD application on the user device 50 associated with the user. The models are stored in accordance with various searchable parameters; thereby permitting searches to be performed automatically by entering one or more parameters. The parameters suitably include a part number, a word or phrase describing the part, CAD application, Program usage, and/or Product Data Management (PDM) storage system or a combination of these parameters. Searches can also be manually performed by progressing interactively through descriptive part tables and the options presented via the user interface application. Exemplary searches are shown below in FIGS. 3-12. At block 110, the results of the search are presented to the user device 50. Then, at decision block 116, the user determines if the result of the search has presented the part the user intended to insert into the design/product. If the results of the search do not include the desired part, the user is encouraged to perform a new search or end the search at block 118. If, at decision block 116, the desired part was included in the results of the search, the user may set a PDM filter (if not already set in the initial search) at block 120 based on the target PDM system in which the desired part is to be included. By selecting a model from the provided results and selecting the "ADD PART" button provided on the user interface application, at block 122, the solid model associated with the desired part and stored in the solid model library device 48 is added to the parts list for the user and simultaneously is added to the PDM system identified by the PDM filter option selected. If the added part previously exists in the target PDM system, the model addition function to the PDM system is bypassed. The solid model that is added to the parts list is added based on the CAD application that the user sets at the associated user device 50. Once the user is ready to insert the selected solid model into a design within the CAD application on their associated user device 50, at block 124, the solid model from the parts list is inserted into the CAD application workspace.

Figure 3:
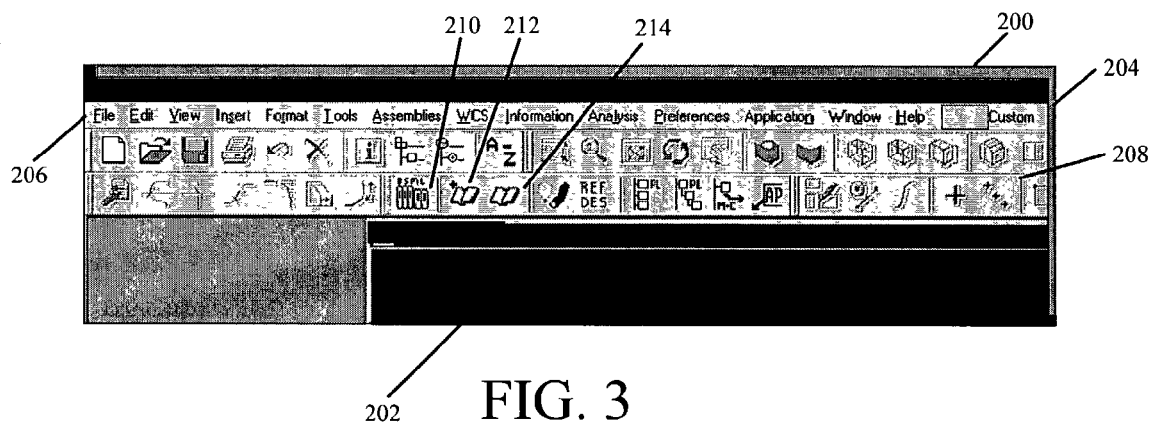
Figure 4:
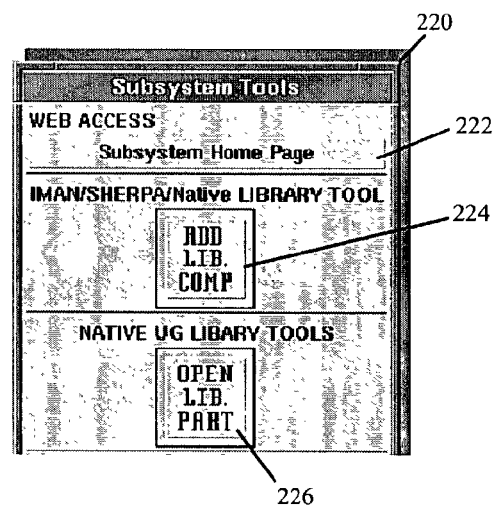
Figure 5:
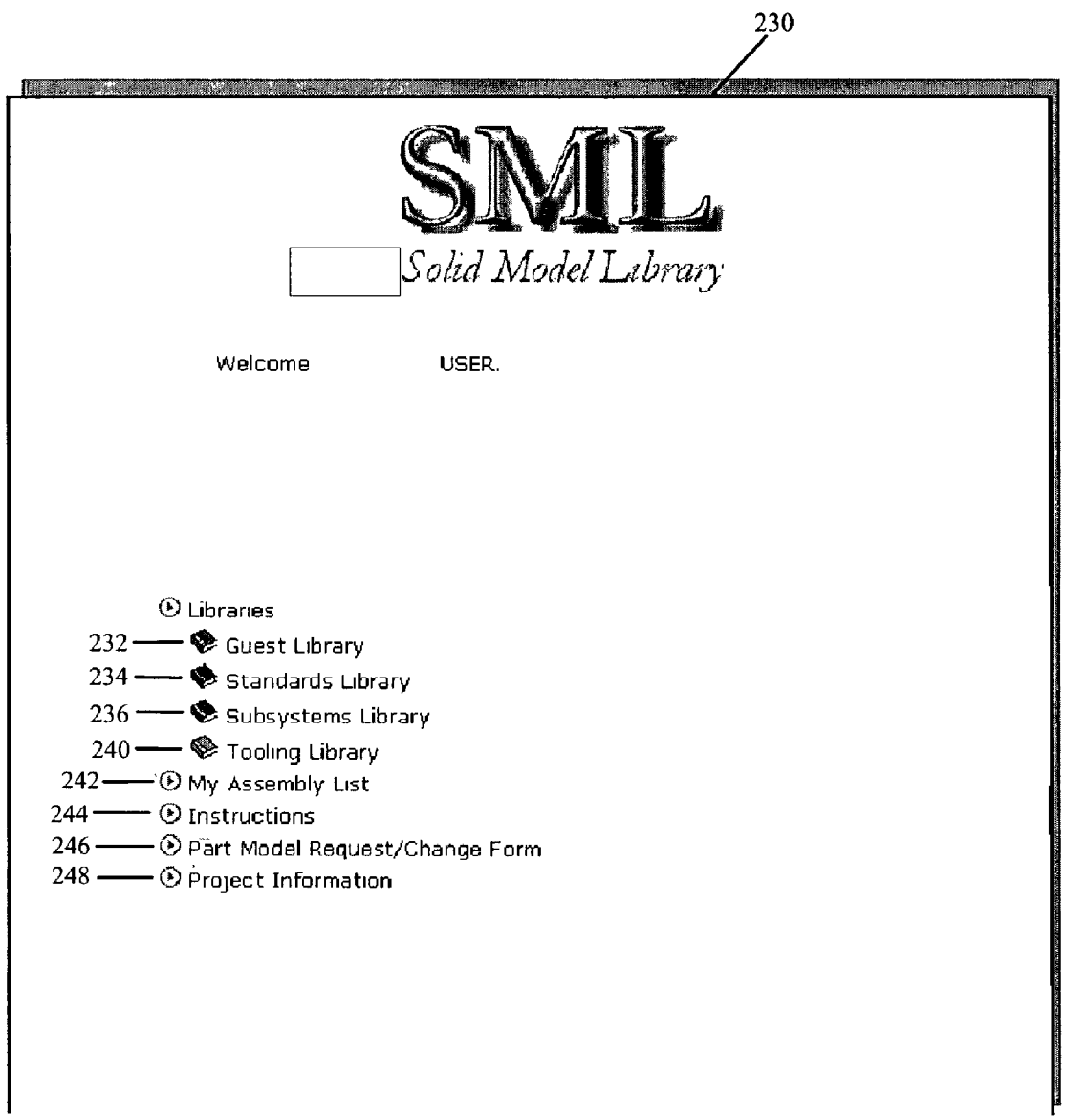

FIGS. 3 and 4 illustrate different, exemplary ways in which the SML tool may be accessed from the solid model library device 48 (FIG. 1). FIG. 3 illustrates a partial screen shot of a graphics application program window 200. The graphics application program window 200 includes a workspace 202 and a menu area 204. The menu area 204 includes pull-down menus 206 as well as function buttons 208 for directly accessing a specific function. The function buttons 208 include an SML TOOL ACCESS button 210, an ADD SOLID MODEL button 212, and an OPEN SOLID MODEL (in an independent CAD workspace) button 214. Selection of the SML TOOL ACCESS button 210 allows the user access to the SML tool through a previously opened network application program window or by spawning a network application program window and providing access to the SML tool as shown in FIG. 5. Selection of the ADD SOLID MODEL button 212 inserts the selected solid model chosen during the search or selected from the previously created parts list associated with the user into the workspace 202. Selection of the OPEN SOLID MODEL button 214 opens the model chosen during the search or selected from the previously created parts lists associated with the user in an independent CAD workspace 202. This is shown and described in more detail below in FIG. 12.

FIG. 4 illustrates a subwindow 220 that includes buttons 222, 224, and 226 that perform the same functions as the buttons 210, 212, and 214 of the CAD application window 200 shown in FIG. 3. The subwindow 220 is presented upon selection of a SML tool function included in a pull-down menu of a particular CAD application. It will be appreciated that access to a network-based SML tool through a graphics program can be performed in ways different than that shown in FIGS. 3 and 4. For example, selections of the buttons 210, 212, 214, 222, 224, and 226 are suitably performed by manipulating a cursor over the desired button or screen location using a user interface device or alternate selection device. Other user interface tools, such as voice actuation software, Personal Data Assistant (PDA) via satellite links, laptop computer, or similar portables devices can be used to gain access to the SML tool or perform selections with the SML tool or with the CAD application.

Figure 6A:
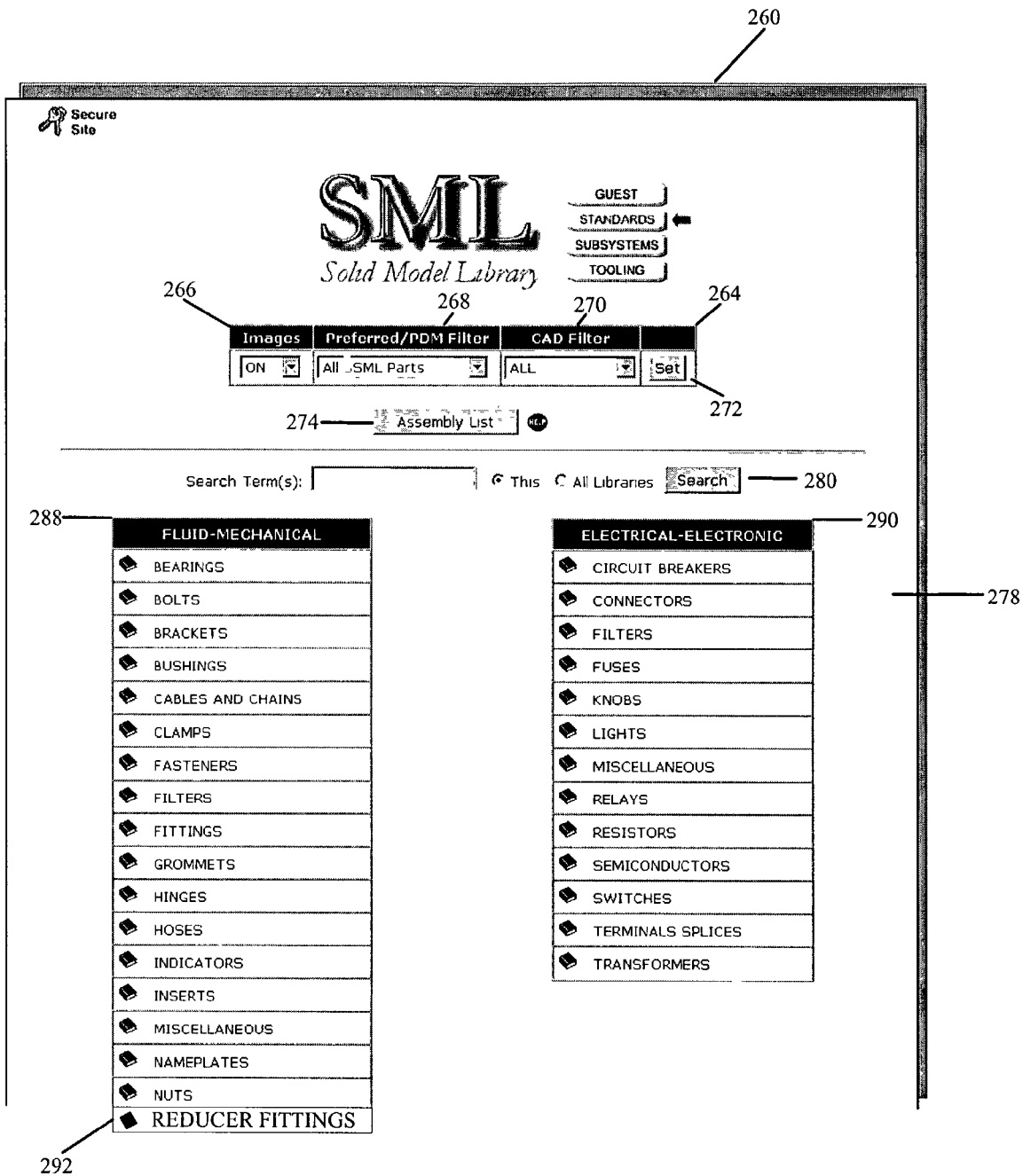

FIG. 5 illustrates a table of contents page 230 of the SML tool accessed by a user at a user device 50 (FIG. 1) from the solid model library device 48 (FIG. 1) over the network 52 (FIG. 1). Access to the table of contents page 230 can be provided by successful execution of a predefined password protected login page or window. A password or login process can be used to limit the number of users to only those that require the use of the SML tool and track and maintain metrics on access/usage per individual user. The table of contents page 230 includes hyperlink text that upon selection provides access to an associated entry window(s). In the SML example, the hyperlink text suitably includes a GUEST LIBRARY link 232, a STANDARDS LIBRARY link 234, a SUBSYSTEMS LIBRARY link 236, a TOOLING LIBRARY link 240, a MY ASSEMBLY LIST (synonymous with the user parts list) link 242, an INSTRUCTIONS link 244, a PART MODEL REQUEST/CHANGE FORM link 246, and a PROJECT INFORMATION link 248. User selection of any one of the hyperlink text included within the table of contents page 230 presents the page or pages associated with the hyperlink text. Selection of the STANDARDS LIBRARY link 234 presents a first search page 260 as shown in FIG. 6A. Selection of the GUEST LIBRARY link 232 presents the user an entry point to the models and data available within a Guest Library of the SML tool. The Guest Library is the storage area for the solid models created and added by users to the SML tool and serves as a staging area for those models until validation can be performed. Selection of the SUBSYSTEMS LIBRARY link 236 presents the user an entry point to the models and data available within a Subsystems Library a of the SML tool. The Subsystems Library is the storage area within the SML tool for the solid models affiliated with Subsystem design. Selection of the TOOLING LIBRARY link 240 presents the user an entry point to the models and data available within the Tooling Library of the SML tool. The Tooling Library is the storage area within the SML tool for the solid models affiliated with Tooling design. Selection of the INSTRUCTIONS link 244 presents the user an entry point to on-line instructions documentation provided for SML tool operation and set-up. Selection of the PROJECT INFORMATION link 248 presents the user an entry point to the documentation available regarding the SML tool project information. Selection of the MY ASSEMBLY LIST link 246 presents the parts list for the associated user; for example, see parts list page 380 in FIG. 12. Selection of the PART MODEL REQUEST/CHANGE FORM link 246 presents a form page 420 from which a new part model request or existing model change can be initiated, as shown in FIG. 13. This is a semi-automatic process that tracks the request as progress is completed.

FIG. 6A illustrates a beginning search page 260 that is presented upon selection of the hypertext STANDARDS LIBRARY link 234 shown in FIG. 5. The search page 260 includes a filter section 264 and a search section 278. The filter section 264 includes a number of different selectable filters that a user sets prior to searching for a part to add to the user parts list. The filter section 264 includes an IMAGES pull-down menu 266, a PREFERRED/PDM filter pull-down menu 268, and a CAD filter pull-down menu 270. The filter section 264 also includes a SET button 272 that when activated applies the selected filter settings, based on the selections in the pull-down menus 266, 268, and 270, used in the search for the solid models to be added to the user's parts list. The IMAGES filter 266 allows the user to toggle the model images provided on the selection tables to be displayed or not displayed. Choosing to not have the images displayed will increase the speed and performance of the searching application. The search page 260 also includes an ASSEMBLY LIST button 274 that when selected displays the present user's parts list (see FIG. 12). The search area 278 includes a search term entry field 280, and interactive sub-categorical listings such as a FLUID-MECHANICAL parts title list 288, and an ELECTRICAL-ELECTRONICS parts title list 290. In this embodiment, the user can search for models in a number of different ways. The user can enter a part name or phrase into the search field area 280. A search is executed upon selection of the SEARCH button located in the search field area 280. The user can select whether to search all libraries or the library that the designer is presently interacting with. As shown in FIG. 6A, the library selected is the STANDARDS LIBRARY, the current library. This indicates that no other library, meaning the SUBSYSTEMS, TOOLING or GUEST LIBRARIES will be searched. The sub-categorical lists, for example the FLUID-MECHANICAL list 288 includes an alphabetical list of fluid-mechanical parts that are hyperlinked to more detailed lists of parts associated with the part title.

Figure 6B:
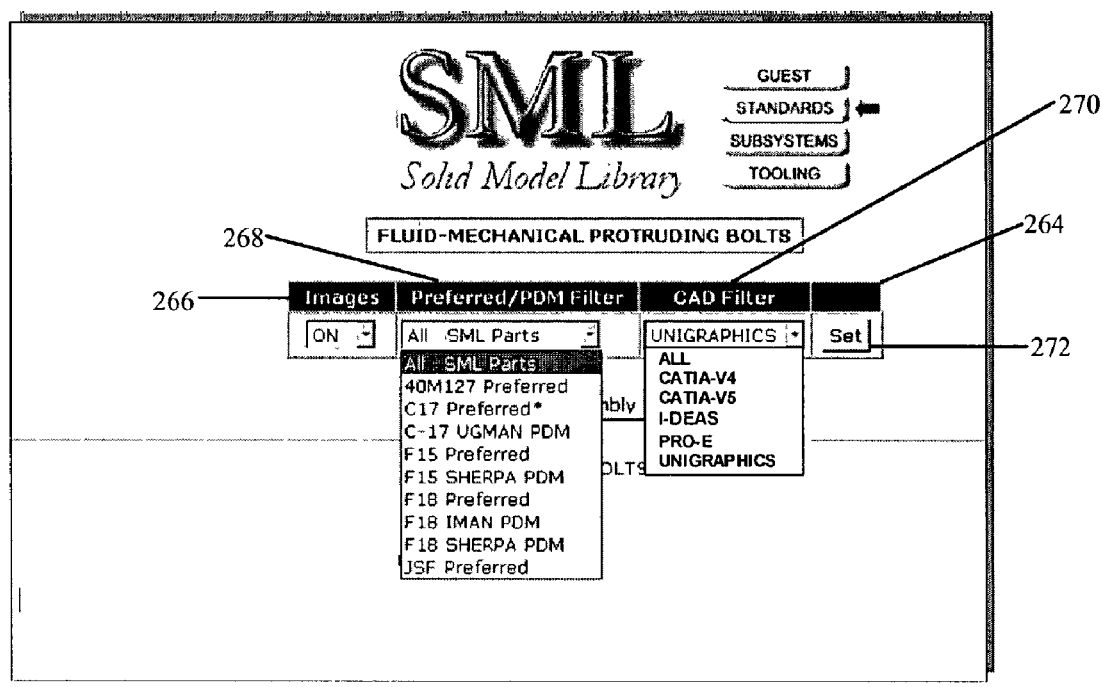

FIG. 6B illustrates an exemplary list of the selectable filters presented in the PREFERRED/PDM filter pull-down menu 268 and the CAD filter pull-down menu 270. The IMAGES pull down menu 266 allows the user to toggle the images provided in the search results to be displayed or not displayed. Not displaying the images increases the speed and performance of the search. The PREFERRED/PDM filter selections allow the user to only be presented in the search results those part families that are listed on those filter lists. A Preferred filter list allows only the part families considered on that particular list to be displayed to the user. Those part families have been deemed acceptable for use by an Authoritative Source (i.e. Program Administration) and consequentially, any part selected from the results of a search performed utilizing that filter can be automatically loaded to a PDM if a validated model for that part family exists in the SML tool. The PDM filter list displays to the user only those part models that are currently available in the PDM system selected and indicates to the CAD application being operated from which PDM the selected part model should be extracted and loaded into the CAD workspace.

Figure 7:
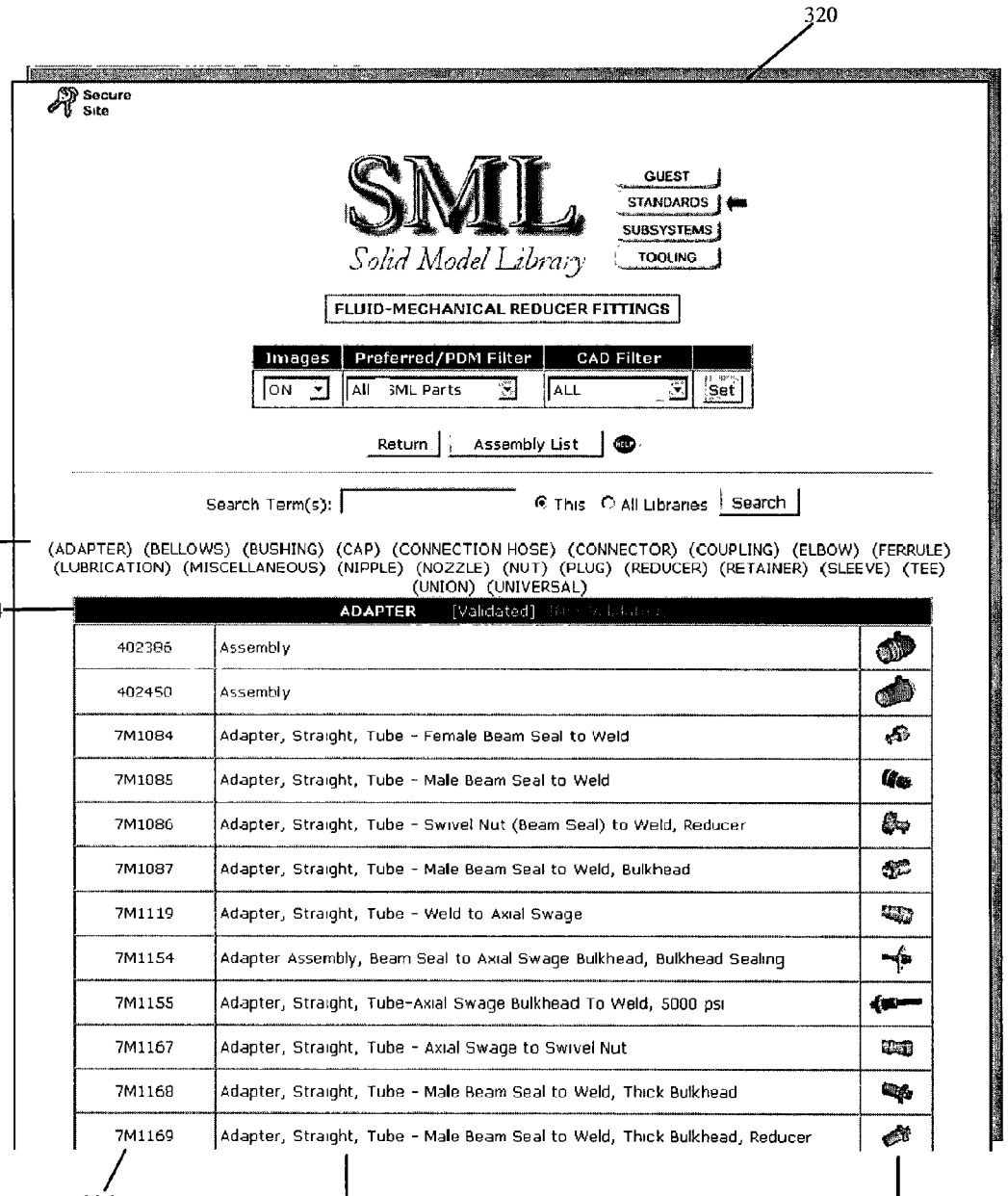

Referring now to FIG. 7, upon selection of the REDUCER FITTINGS title 292 from the FLUID-MECHANICAL list 288 from the search page 260, the user is presented with a list of hyperlink reducer fitting subtitles 330 as shown in window 320. After the user selects or highlights one of the subtitles from the list of subtitles 330, a parts table 334 associated with selected or highlighted subtitle is displayed for the user in the window 320. The table 334 includes a general PART FAMILY NUMBER column 336, a PART NOMENCLATURE column 340, and an IMAGE column 344. In the example shown in FIG. 7, the user has selected or highlighted the subtitle ADAPTER from the subtitles list 330 thereby presenting the parts associated with the adapter subtitle. The IMAGE column 344 includes a perspective view of the associated solid model.

Figures 8, 9:
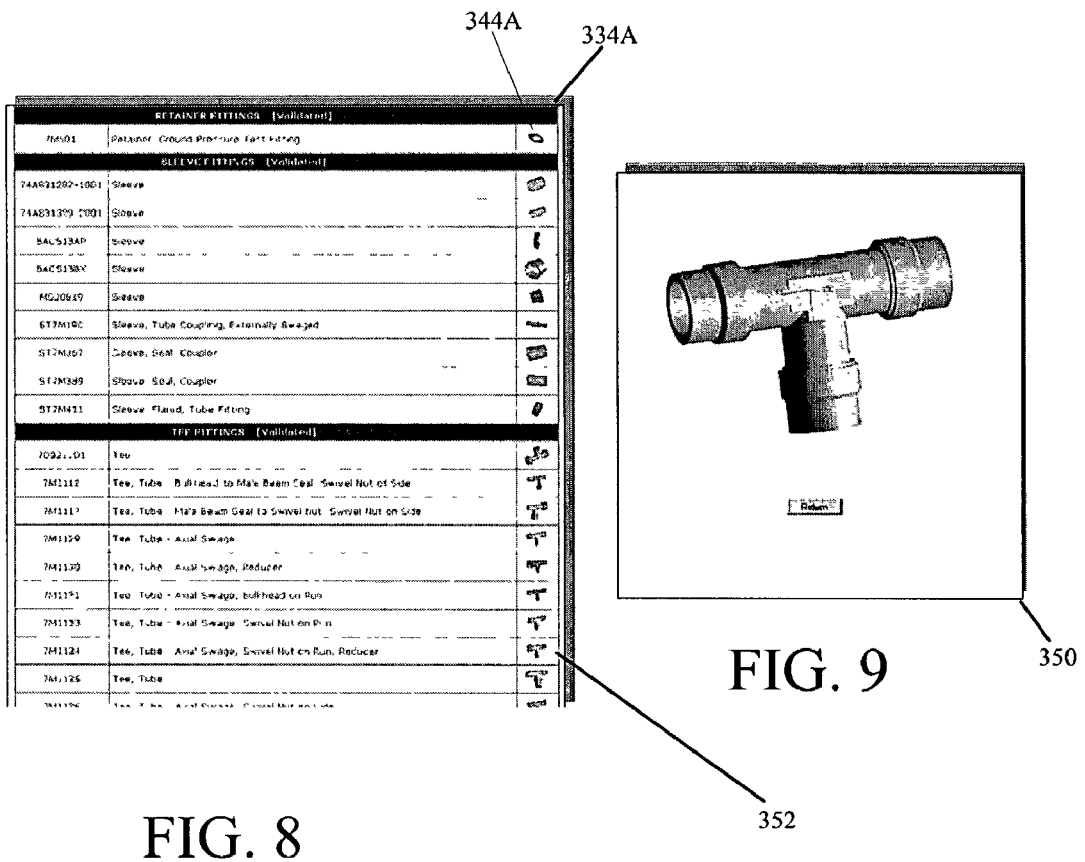

FIG. 8 illustrates a parts table 334A with image column 344A for the retainer, sleeve, and tee fittings subtitles presented in the subtitle list 330 under fluid-mechanical reducer fittings (FIG. 7). If the user selects an image from the image column 344A an enlarged version of the image of the associated solid model is shown in a solid model window 350. As shown in FIG. 9, a selection of an image 352 in column 334A for tee fitting part number 7M1134 titled "Tee, Tube-Axial Swage, Swivel Nut on Run, Reducer" resents a larger perspective view of the associated solid model. The presentation of the solid model in an enlarged view in the window 350, allows the user to visually better determine if that is the correct part for the intended purpose and determine the orientation of the model for placement in the CAD application workspace.

Figure 10:
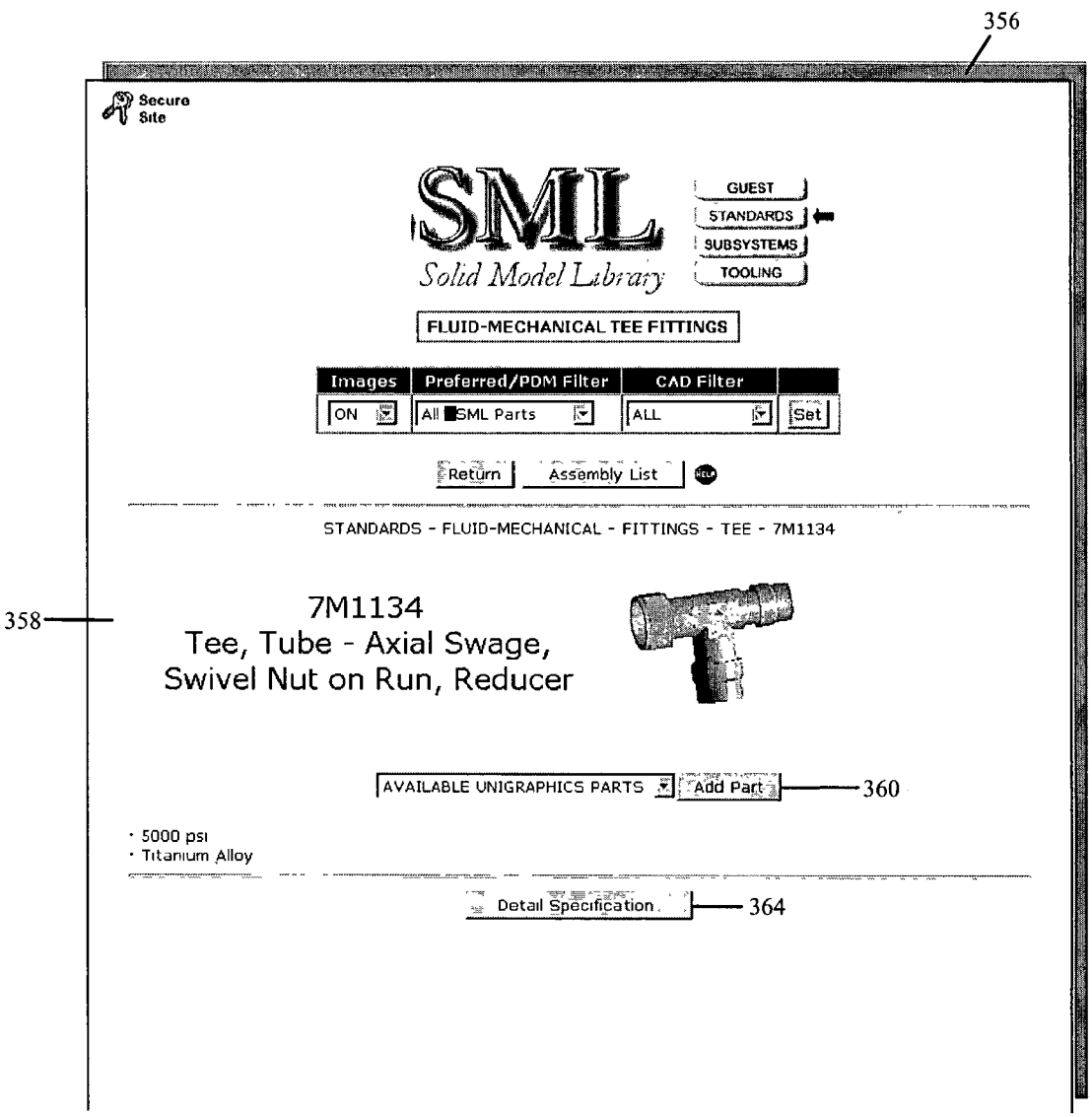

FIG. 10 illustrates a part family window 356 that is displayed upon selection of a part number from the part number column 336 or the nomenclature from the part nomenclature column 240 from the table 334. For example, if the user selects either the part number 7M1134 or the nomenclature from the parts list window 334A for the same part, the part window 356 is presented. The part window 356 includes a part area 358 that includes a perspective view of the associated solid model, the part number, and the part nomenclature. The part area 358 also includes a pull-down menu 360 that allows the user to select from the available solid models for that part family in various stored CAD application formats. The pull-down menu 360 includes an ADD PART button that when activated adds the selected detailed part to the user's assembly/parts list. Also included in the window 356 is a DETAILED SPECIFICATION button 364 that accesses a detailed specification window 370 shown in FIG. 11, if available.

Figure 11:
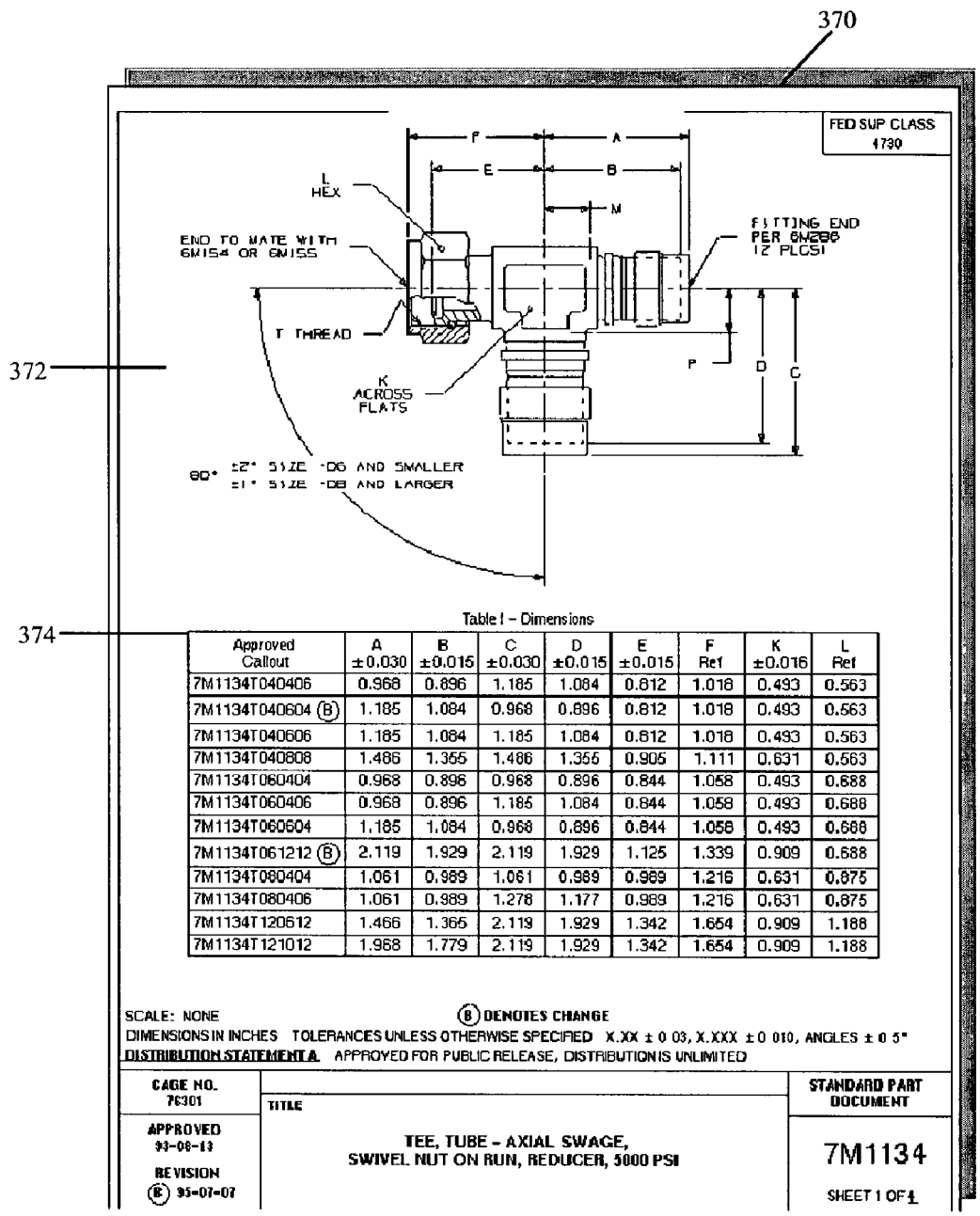

As shown in FIG. 11, the detailed specification window 370 suitably includes a detailed specification image 372, a dimensions table 374, or other forms of data pertinent to the subject part family. In the example shown, the detailed specification image 372 identifies a plurality of dimensions and the parts list table 374 includes dimensions for each of the plurality of dimensions for a plurality of different subparts all associated with the base part number 7M1134. It is from this additional detailed specification data that the user may derive the necessary information to make a proper selection.

Figure 12:
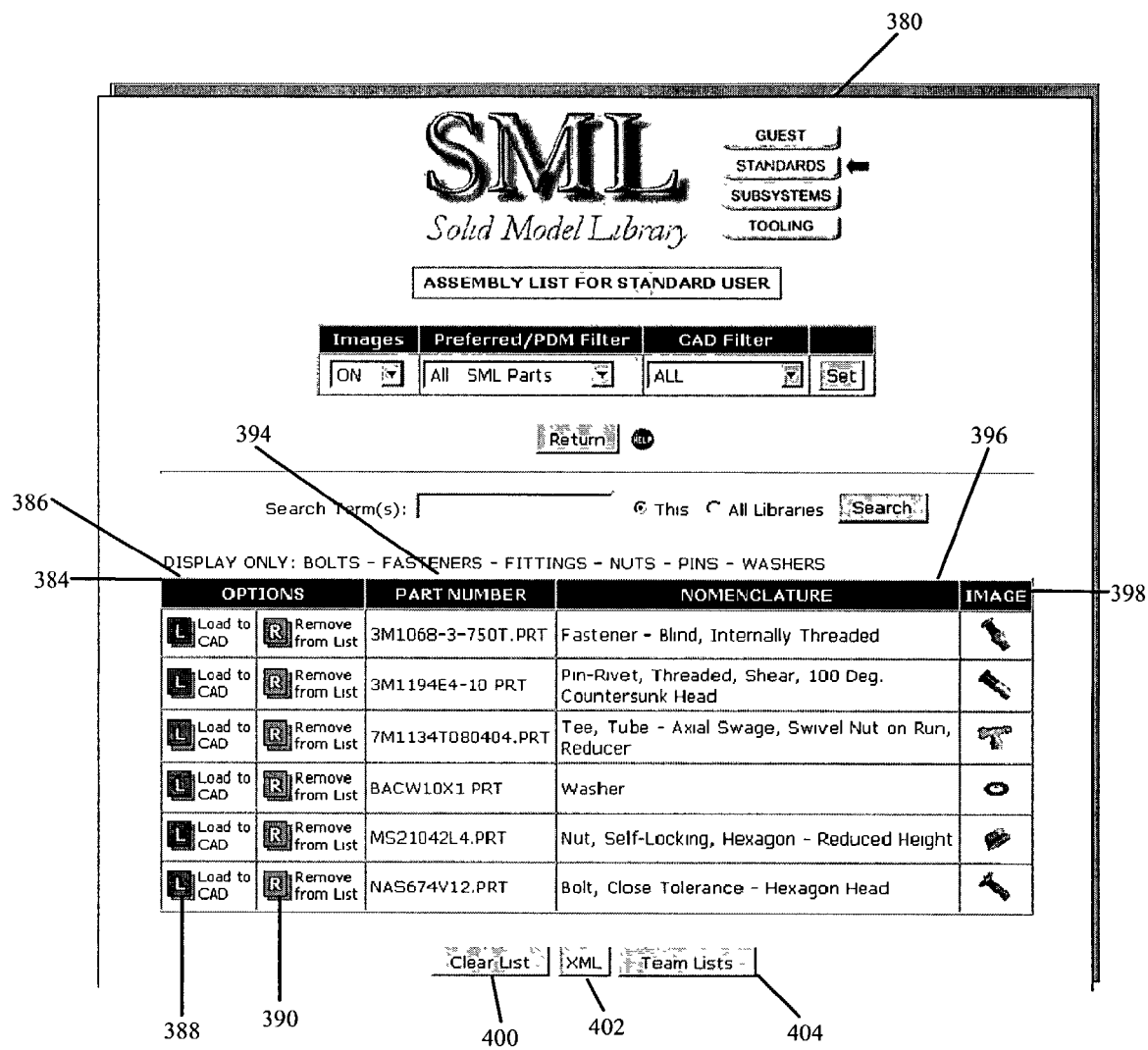

FIG. 12 illustrates an assembly/parts list window 380 that is presented upon selection of any ASSEMBLY LIST button 274. The ASSEMBLY LIST button 274 is presented in multiple windows (FIGS. 6A, 10, and 11). The assembly list window 380 includes a table 384 that includes a list of all the solid models that have been added to the assembly/parts list by the user. The table 384 includes an OPTIONS column 386, a PART NUMBER column 394, a NOMENCLATURE column 396, and an IMAGE column 398. The columns 394, and 396 include hyperlink text or images that upon selection access the associated part window, such as that shown in FIG. 10. Selection of an image in the image column 398 presents an enlarged image of the associated selected solid model in a solid model window, e.g. FIG. 9. The OPTIONS column 386 includes a LOAD TO CAD button 388 and a REMOVE FROM LIST button 390. Selection of the LOAD TO CAD button 388 sends the associated solid model identifier to the user's presently running CAD application to be opened or added via the SML Tool buttons within the CAD application, see FIGS. 3 & 4. Selection of the REMOVE FROM LIST button 390 deletes the solid model from the list 384. Also included in the assembly list window 380 are a CLEAR LIST button 400, an XML button 402, and a TEAM LISTS button 404. When the user activates the clear list button 400, all part models listed in the entire table 384 are cleared. The XML button 402 may be used to create a file in extensible Markup Language—(XML) format for use in other applications. The TEAM LIST button 404 shall take the user to the "Team" page from which the user may create a new Team list or append a current Team list to their Part List. Team Lists are predetermined Part Lists, usually created by Program Management, that can be adopted by users to immediately provide a list of approved part/component models to be used without having to manually build a Part List.

FIG. 13 illustrates the PART MODEL REQUEST/CHANGE FORM window 420. The window 420 is presented upon selection of the part model request/change form link 246 from window 230. Using the window 420 the user or model creator can request that a new solid model be created and added to the SML tool, or request corrections be made to an existing model in the SML tool. Once the requester has completed the part model request/change form, the information on the form is sent to the appropriate authority for disposition. Once the request has been completed and certified, the approved model is entered into the solid model library device 48.

While the preferred embodiment of the invention has been illustrated and described, as noted above, many changes, particularly those that open the described applications, methods, processes and technologies to all forms of electronic data, can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method for retrieving electronic data over a network, the method comprising:
   storing a plurality of computer solid models in a central computer system coupled to a network, wherein a plurality of the solid models have associated search criteria;
   receiving search criteria at the central computer system from a user computer system over the network;
   searching the central computer system based on the received search criteria; and
   presenting the results of the searching at the user computer system.

2. The method of claim 1, further comprising:
   receiving a selection of a solid model from the presented results; and
   adding the selected solid model to a design application program executed on the user computer system.

3. The method of claim 1, further comprising receiving a request to change a solid model stored in the central computer system.

4. The method of claim 1, further comprising receiving a request to add a new solid model to be stored in the central computer system.

5. The method of claim 1, wherein a plurality of the solid models are stored in a plurality of design application program formats.

6. The method of claim 1, wherein products include aircraft models.

7. The method of claim 1, wherein the presented results include one or more solid models, the method further comprising:
   selecting a solid model from the presented results; and
   saving the selected solid model in a user defined list.

8. The method of claim 7, further comprising adding the one or more solid models saved in the list to a design application program executed on the user computer system.

9. A system for retrieving electronic data over a network, the system comprising:
   a central computer system coupled to the network, the central computer system includes memory that stores a plurality of computer solid models wherein the plurality of the solid models have associated search criteria; and
   a plurality of user computer systems coupled to the network, each of the plurality of user computer systems including:
      a display device;
      a processing device coupled to the display device, the processing device including a first component configured to access an application program of the central computer system, and a second component configured to present images on the display device; and
      a user interface device coupled to the processing device configured to enter a search criteria in the accessed application program, the entered search criteria includes one or more physical features and one of products;
   wherein the application program includes:
      a first component configured to search the memory of the central computer system based on the entered search criteria; and
      a second component configured to send results of the search to the user computer system;
   wherein the second component of the processing device is configured to present the sent results of the search on the display device.

10. The system of claim 9, wherein the processing device further includes a design application program, and wherein the application program is further configured to allow selection of a solid model from the presented results and add the selected solid model to the design application program.

11. The system of claim 9, wherein the application program is further configured to allow a request for a change to a solid model stored in the central computer system.

12. The system of claim 9, wherein the application program is further configured to allow a request for an addition of a new solid model to be stored in the central computer system.

13. The system of claim 9, wherein a plurality of the solid models are stored in a plurality of design application program formats.

14. The system of claim 9, wherein products include aircraft models.

15. The system of claim 9, wherein the presented results include one or more solid models, and wherein the application program is further configured to allow selection of a solid model from the presented results and save the selected solid model in a list.

16. The system of claim 15, wherein the processing device further includes a design application program, and wherein the application program is further configured to add the one or more solid models saved in the list to the design application program.

17. A system for retrieving electronic data over a network, the system comprising:
   a central computer system coupled to the network, the central computer system includes an application program that stores a plurality of computer solid models, wherein a plurality of the solid models have associated search criteria; and a plurality of user computer systems coupled to the network, each of the plurality of user computer systems including:

a display device;

a processing device coupled to the display device, the processing device including a first component configured to access the application program of the central computer system, and a second component configured to present images on the display device; and a user interface device coupled to the processing device configured to enter a search value in the accessed application program based on at least one component of the search criteria;

wherein the application program includes:

a first component configured to search the central computer system based on the entered search value; and a second component configured to send results of the search to the user computer system;

wherein the second component of the processing device is configured to present the sent results of the search on the display device;

wherein the presented results include one or more solid models, and wherein the application program is further configured to allow selection of a solid model from the presented results and save the selected solid model in a list; and wherein a plurality of the solid models are stored in a plurality of design application program formats.

18. The system of claim 17, wherein the processing device further includes a design application program, and wherein the application program is further configured to add the one or more solid models saved in the list to the design application program.

19. The system of claim 17, wherein the processing device further includes a design application program, and wherein the application program is further configured to allow selection of a solid model from the presented results and add the selected solid model to the design application program.

20. The system of claim 17, wherein the application program is further configured to allow a request for a change to a solid model stored in the central computer system.

21. The system of claim 17, wherein the application program is further configured to allow a request for an addition of a new solid model to be stored in the central computer system.

* * * * *